(12) United States Patent
Lee

(10) Patent No.: US 6,377,200 B1
(45) Date of Patent: Apr. 23, 2002

(54) ANALOG-TO-DIGITAL CONVERTER

(75) Inventor: Ho-Young Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/595,744

(22) Filed: Jun. 16, 2000

(30) Foreign Application Priority Data

Jun. 16, 1999 (KR) ............................................ 99-22497

(51) Int. Cl.$^7$ ................................................ H03M 1/12
(52) U.S. Cl. ...................................... 341/155; 341/158
(58) Field of Search ................................ 341/155, 158, 341/159, 160, 161; 327/74, 75

(56) References Cited

U.S. PATENT DOCUMENTS 4,539,551 A * 9/1985 Fujita et al. .................. 327/74
5,075,688 A * 12/1991 Hosotani et al. .............. 327/74
6,198,420 B1 * 3/2001 Ryan et al. .................. 341/155

OTHER PUBLICATIONS

Dingwall, Andrew G. F., "Monolithic Expandable 6 Bit 20 MHz CMOS/SOS A/D Converter ," IEEE Journal of Solid–State Circuis, Vol. SC–14, No. 6, Dec. 1979, pp. 926–932.

Spalding, Joe, "SA 19.5: A 200Msample/s 6b Flash ADC in 0.6μm CMOS ," 1996 IEEE International Solid–State Circuits Conference, Feb. 1996, ISSCC96/Session 19/Data Conversion/Paper SA 19.5, pp. 320–321, 466.

Tsukamoto, Sanroku et al, "A CMOS 6–b, 200 Msample/s, 3V–Supply A/D Converter for a PRML Read Channel LSI ," IEEE Journal of Solid–State Circuits, vol. 31. No. 11, Nov. 1996, pp. 1831–1836.

\* cited by examiner

*Primary Examiner*—Tuan T. Lam
(74) *Attorney, Agent, or Firm*—Skjerven Morrill MacPherson LLP; David W. Heid

(57) ABSTRACT

An analog-to-digital converter is disclosed, including: a reference generator circuit for generating a plurality of reference voltages; a plurality of amplifying comparators for receiving the reference voltages and analog input signals, each amplifying comparator including: two amplifying paths, each of which has a first amplifier and a second amplifier for alternatively receiving signals from the two paths; a latching comparator having a plurality of latches and receiving output signals from the amplifying comparator; and a digital decoder receiving output signals from the latching comparator and generating a predetermined number of data bits.

5 Claims, 7 Drawing Sheets

ANALOG-TO-DIGITAL CONVERTER

This application relies for priority upon Korean Patent Application No. 1999-22497, filed on Jun. 16, 1999, the contents of which are herein incorporated by reference in their entirety.

1. Field of the Invention

The present invention relates to an analog-to-digital converter, and more particularly to an analog-to-digital converter operable in a high speed operation.

2. Background of the Invention

An analog-to-digital converter (ADC), converting an analog signal to a digital signal, has many applications in electronic signal processing systems. In particular, the ADC is becoming a more useful component in accordance with an increase of mixed-mode systems. It may be proper for the advanced mixed-mode systems, DVDP (digital video disk player) or DBSR (direct broadcasting for satellite receiver), which would be the foremost applications in the market of household electrical appliances, to be manufactured with low cost and in a one-chip by a CMOS process. For the purpose of that, it is important to provide an ADC capable of conducting a radio frequency (RF) signal of high bandwidth to the system. Such an ADC may be on desire of being operable in high frequency over 100 MHz and having the characteristic of a medium resolution.

Now, among the ADCs of various types proposed by now, "flash" ADC has been disclosed in IEEE Journal of Solid State Circuit on December 1979 (Vol. SC-14, pp. 926~932) by Andrew G. F. Dingwall. In the Dingwall's flash ADC, an input signal is compared with reference voltages that are of different levels each other and converted into a digital signal at once, by means of amplifiers the number of which corresponds to a predetermined resolution. The flash ADC is advantageous for a fast conversion adaptable to an operating frequency of the one-chip mixed system even though it has a number of circuit elements. As shown in FIG. 1, the flash ADC is composed of reference voltage generator 10, amplifying circuit 20, and latch circuit 30. The reference voltage generator 10 establishes 64 reference voltage levels Vref1~Vref64 from two external reference voltages Vreft and Vrefb between which 65 resistors R1~R65 are connected in serial. Pre-amplifiers PA1~PA64 of the amplifying circuit 20 are differential amplifiers receiving the reference voltages Vref1~Vref64 and input voltage Vin. Sixty-four latches L1~L64 of the latch circuit 30 receives and stores amplified voltages VA1~VA64 from the pre-amplifiers PA1~PA64. Each of output data bits DO1~DO64 generated from the latch circuit 30 is set into six bits by a coding process.

Although the flash ADC of FIG. 1 can accomplish a function of fast and precise data conversion, there are static offsets (most physical) at the pre-amplifiers due to a variation of manufacturing process, external noises, or element parameters. The static offsets would cause the amplifying precise to be worse and a reliable conversion to degrade thereby. In order to eliminate the static offsets, there has proposed of "auto-zero function" in which sampling operations for the difference between the reference voltages Vreft and Vrefb and for the offsets at the pre-amplifiers are employed. However, such auto-zero function does not overcome a limitation of an increase of RC delay time due to sampling capacitors and an operation speed of the amplifier itself, being impossible to accomplish a flash ADC operable in a very high frequency over 100 MHz.

Other techniques to promote the processing speed of the ADC have been proposed in various types. In "A 200 Msample/S 6 b flash ADC in CMOS" (ISSCC Dig. Tech. Papers, Febuary 1996, pp. 320~321), there is provided a specific period assigning to the auto-zero operation and inhibiting a normal operation of the ADC. Nevertheless, that is not available for a general application, just for very specific application.

In "A CMOS 6-b 200 Msample/s 3V supply converter for a PRML read channel LSI" (IEEE J. Solid State Circuit, Vol. 31, No. 11, pp. 1248~1257, September 1996), dummy amplifiers are additionally provided thereto and the static offsets of the amplifiers are removed by activating the dummy and existed amplifiers in alternative operating modes. It needs a complex circuit arrangement in constructing switches for alternatively selecting the amplifiers and circuits for performing timing operations against the switches.

The fast accessing with a high frequency analog signal is determined by bandwidths and slew rates of analog blocks, while the processing speed with a digital signal accords mostly to a latching time, meta-stability, and a propagation delay time. Although the highest frequency of an analog input signal available to be converted into a digital signal is a half of a clock frequency (according to a theoretical analysis), it is substantial to obtain the operating frequency of 10~20 MHz because of a weak current drivability with the analog circuit block even when the ADC operates in hundreds mega-Hertz. Such insufficient drivability occurs at the top and bottom amplifiers, e.g., PA1 and PA64 in FIG. 1, very seriously. Referring to FIGS. 2A~2C, the top reference voltage Vref1 as the lowest one is located too low, relative to the input voltage Vin. The small votage difference would cause instability of the amplifying operation due to short periods for high and low levels, PH and PL. Although the current drivability of the amplifiers PA64 and PA1 becomes larger therefrom to increase their amplifying ratios, it is hard to overcome the disharmony between the reference voltages. Since the increase amplifying ratios against the input voltage Vin also makes the swing-depth be larger, the amplifiers PA64 and PA1 can not generate their normal output voltages VA64 and VA1 of high and low levels when the input voltage Vin is higher than their corresponding reference voltages Vref64 and Vref1, as shown in FIGS. 2A and 2B, respectively. The amplifiers PA64 and PA1 can do nothing but generating normal-low and high level output signals, VA64 and VA1 respectively. Furthermore, the larger swing depth due to the increased drivability causes timing discords between the input voltage Vin and the mostly one-sided output signals VA64 and VA1, each of the output signals being incapable of following the oscillation of Vin. The two figures about VA64 and VA1 are extreme cases for the malfunction and timing discord. The nearer the top or bottom reference voltages is easier to cause the malfunctions with the output signals from the amplifiers. All those problems may act as a limitation of carrying out the fast conversion, restricting an allowable frequency that is desirable to be high in the ADC.

SUMMARY OF THE INVENTION

Accordingly, it is an object of the invention to provide an ADC capable of performing a faster conversion and a higher resolution.

In order to attain the above object, according to an aspect of the present invention, there is provided an analog-to-digital converter including: a reference generator circuit for generating a plurality of reference voltages; a plurality of amplifying comparators for recieving the reference voltages and analog input signals, each amplifing comparator including: two amplifying paths, each of which has a first amplifier and a second amplifier for alternatively receiving signals from the two paths; a latching comparator having a plurality of latches and receiving output signals from the amplifying comparator; and a digital decoder receiving output signals from the latching comparator and generating a predetermined number of data bits.

Amplifying periods through the two paths are overlapped for predetermined time each other. The amplifying comparator further includes a capacitor for sampling an offset voltage of the first amplifier; a first switch for shorting input and output terminals of the first amplifier; a second switch for resetting the output signals from the first amplifier into a predetermined voltage level in response to a clock signal; and a plurality of switches for controlling a transfer with the reference voltages, the analog input signals, and the output signals from the amplifiers.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The present invention will be described by way of exemplary embodiments, without limitations, illustrated in the accompanying drawings in which like reference symbols denote similar elements, and in which.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 1:
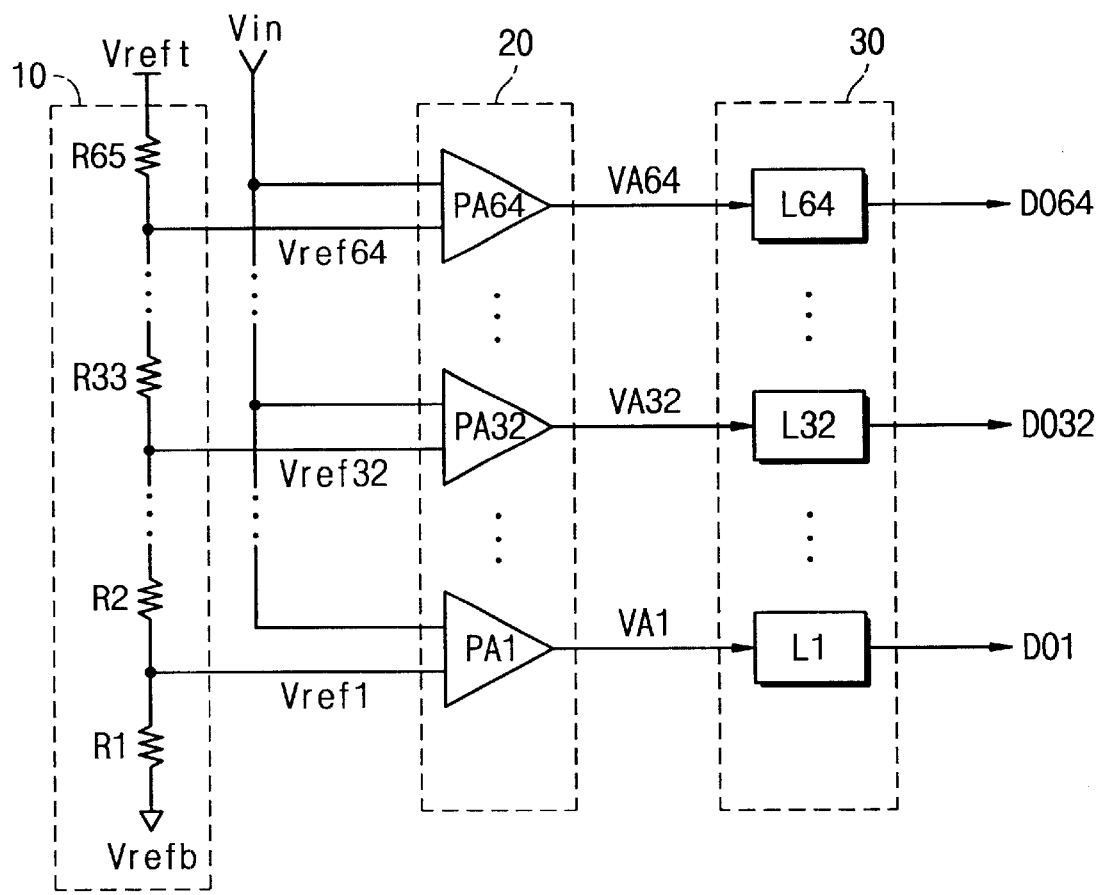
FIG. 1 shows a known construction of a flash ADC.
Figure 2A:
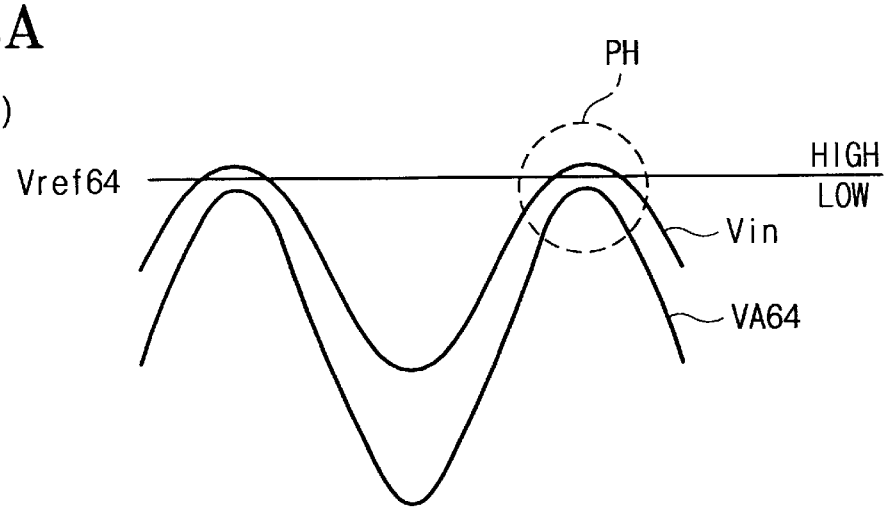
FIGS. 2A through 2C shows waveforms of the input voltage, reference voltages, and amplified voltage signals, assessing in amplifiers of FIG. 1.
Figure 2B:
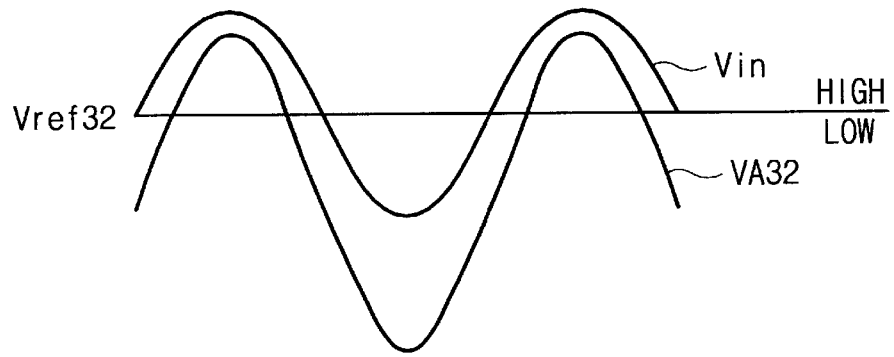
Figure 2C:
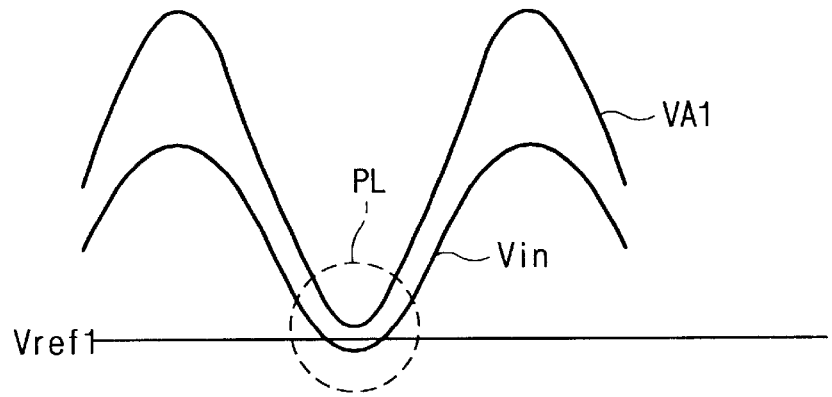
Figure 3:
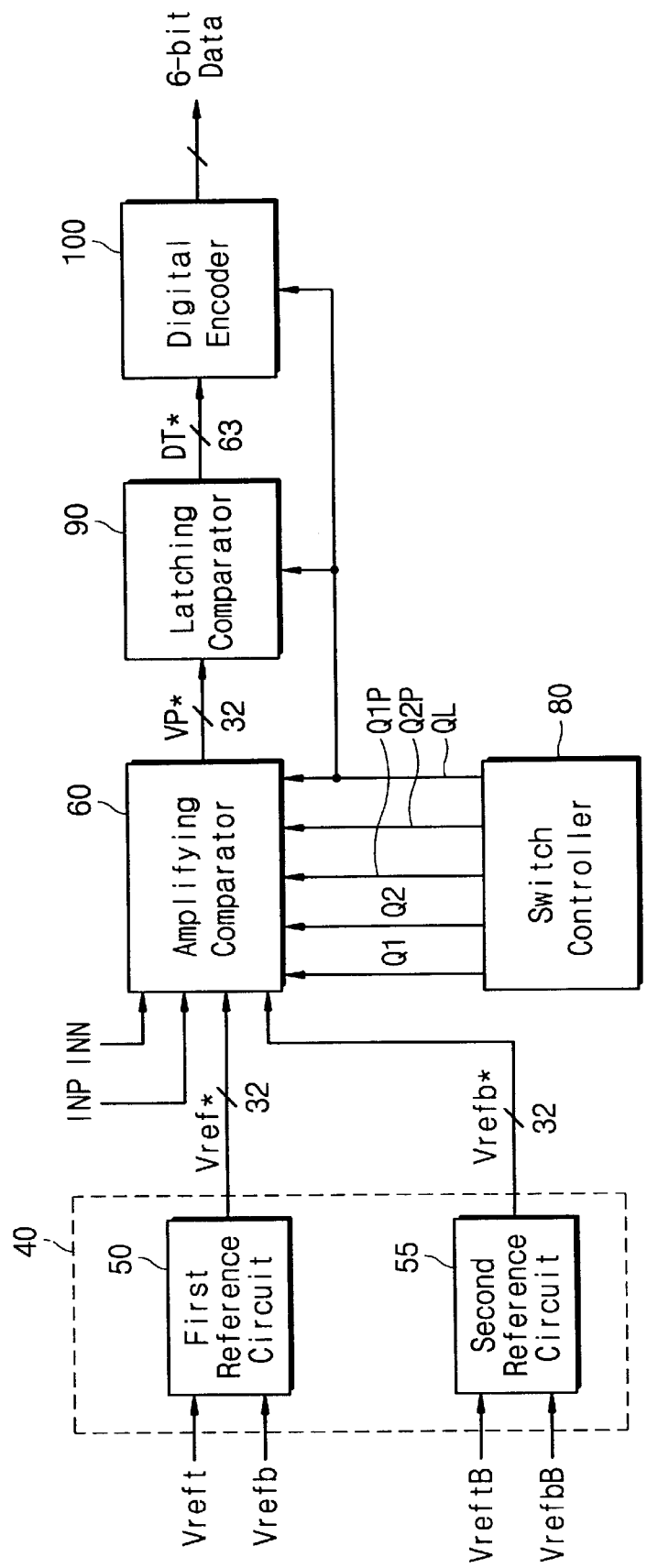
FIG. 3 is a block diagram showing a construction of an ADC according to a preferred embodiment of the invention.

The ADC according to the invention is embodied to be in use for 6-bit digital signals. Referring first to FIG. 3, the ADC includes reference voltage generator 40 including first and second reference voltage circuits 50 and 55, switching controller 80, amplifying comparator circuit 60, latching comparator circuit 90, and digital encoder 100. The first reference voltage circuit 50 of the reference voltage generator 40 receives external reference voltages Vreft and Vrefb, and then generates the first group of reference voltages Vref* (32ea; hereinbelow, "*" denotes there are plural numbers each of which is a pair of bits). The second reference circuit 55 of the generator 40 receives external reference voltages VreftB and VrefbB (hereinbelow, the suffix "B" denotes the signal is a complementary signal), and then generates the second group of reference voltages Vrefb* (32ea). The switching controller 80 generates clock signal QL, switch control signals Q1, Q1N, Q1P, Q2, Q2N, and Q2P. The amplifying comparator circuit 60 includes a plurality of amplifying comparators, thereby comparing the reference voltages, Vref* and Vrefb*, with analog input signals INP and INN, and then generates signals VP* that are amplified signals with the difference between the reference signals and analog input signals. The latching comparator circuit 90 includes a plurality of latching comparators for holding the amplified signals VP* as digital signals DT* that are to be converted into 6-bit data by the digital encoder 100. The feature of the detail interconnection from the reference voltage circuits 50 to the latching comparator circuit 90, through the amplifying comparator circuit 60, is disclosed FIG. 4.

Figure 4:
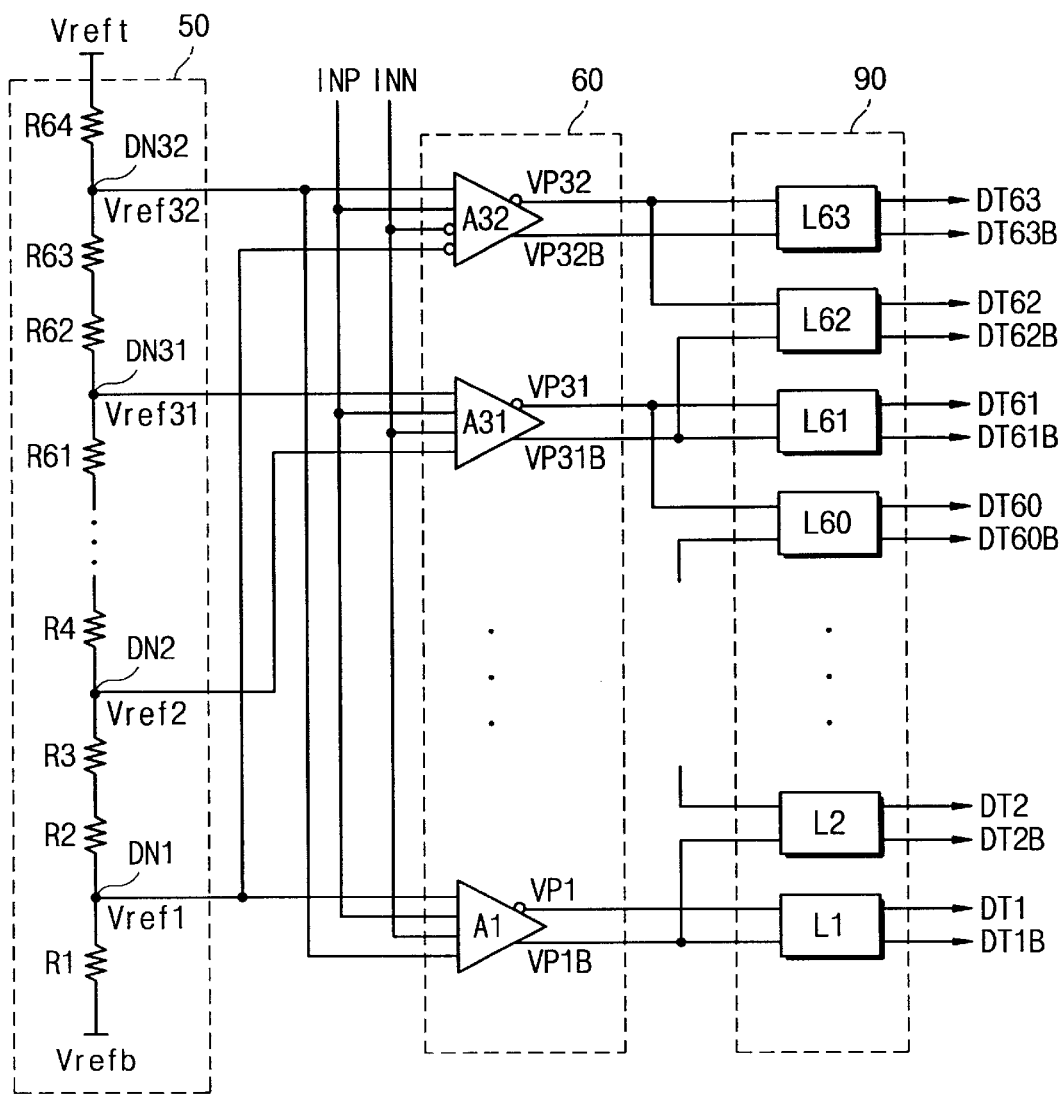
FIG. 4 is a circuit diagram showing an interconnection between the reference voltage generating circuit, the amplifying comparator, and the latching comparator employed in the ADC of FIG. 3, according to the preferred embodiment.

Referring to FIG. 4, the first reference voltage circuit 50 is formed of resistors R1~R64 connected between Vreft and Vrefb in serial, and dividing nodes DN1~DN32 which A are spaced by two resistors. Reference voltages Vref1~Vref32 are established at the dividing nodes DN1~DN32, respectively. It should be understood that the second reference voltage circuit 55 in the reference generator 100 has the same construction as the first reference circuit 50. Amplifying comparators A1~A32 in the circuit 60 receive the analog input signals INP and INN. The dividing nodes DN32 and DN1 are coupled to the input terminal of the amplifying comparator A32, DN31 and DN2 are coupled to the input terminal of the amplifying comparator A31, . . . , and DN32 and DN1 are coupled to the input terminal of the amplifying comparator A1. Each of the amplifying comparators A1~A32 has two pair of inputs and two outputs. The internal construction of each of the amplifying comparators A1~A32 will be explained with FIG. 5.

At the next stage, latching comparators L1~L63 in the circuit 90 are arranged. Amplified signals VP32 and VP32B, as outputs from A32, are coupled to L61, VP31 and VP31B outputs from A31 are coupled to L63, . . . , and VP1 and VP1B outputs from A1 are coupled to L1. The latching comparators L2, L4, . . . , and L62, being interposed between L1, L2, . . . , and L63, receive the amplified signals from their adjacent amplifying comparators. That is, the input of L62 is coupled to VP32 and VP31B, the input of L60 is coupled to VP31 and VP30B, . . . , and the input of L2 is coupled to TP2 and VP1B. The outputs of the latching comparators L1~L63 are digital output signals DT1/DT1B~DT63 /DT63B, respectively.

Figure 5:
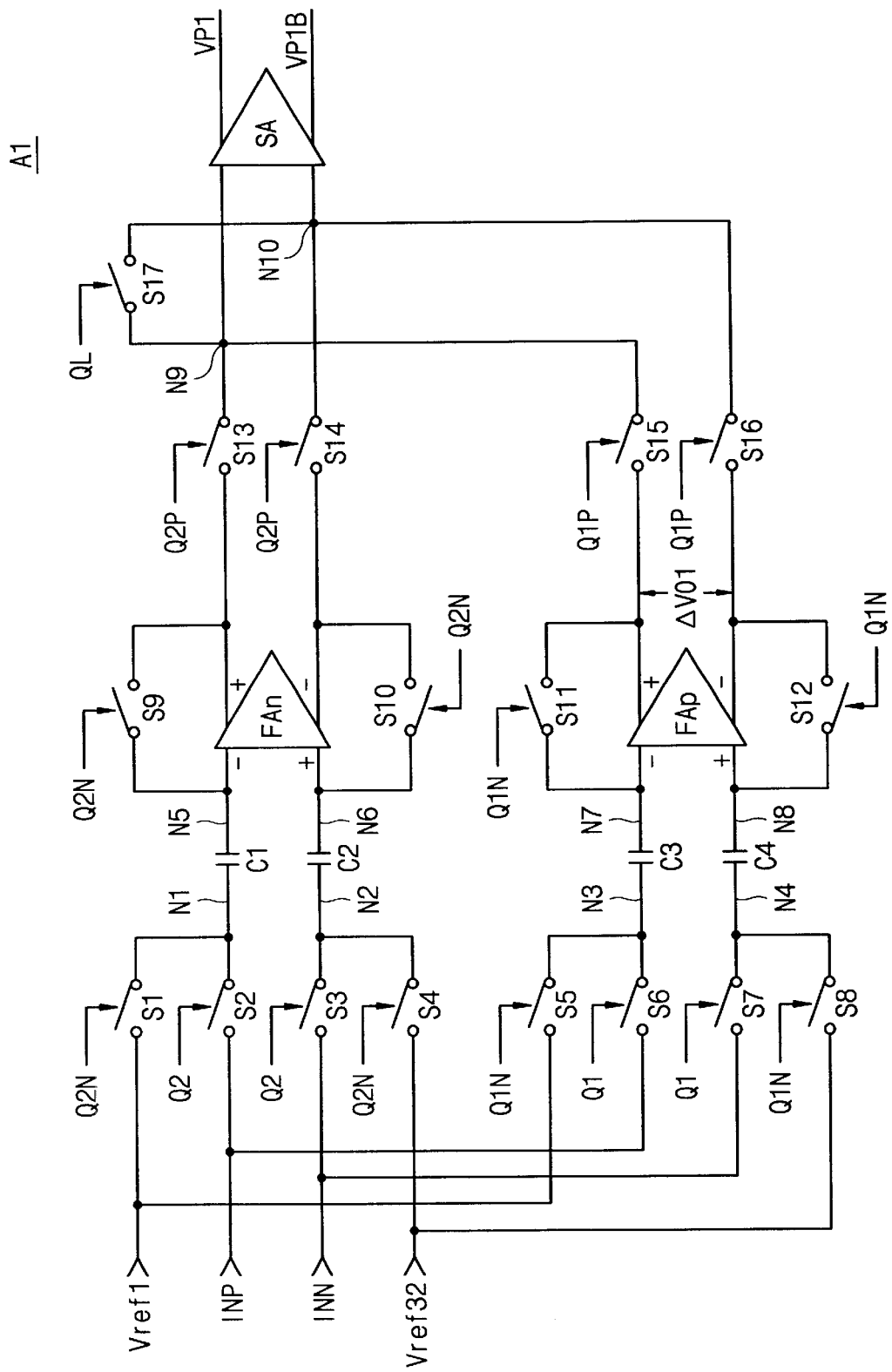
FIG. 5 is a circuit diagram of amplifiers arranged in the amplifying comparator shown in FIG. 4, according to the preferred embodiment.

FIG. 5 shows a circuit construction the amplifying comparator A1 including two differential amplifiers, FAn and FAp, a plurality of switches S1~S17, capacitors C1~C4, and sense amplifier SA. Referring to FIG. 5, switch S1 couples Vref1 to one electrode of the capacitor C1 in which the other electrode is connected to one input terminal of amplifier FAn. The switch S1 is controlled by the signal Q2N generated from the switch controller 80. The switch S2 couples the analog input signal INP to the capacitor C1 and is controlled by signal Q2. The switch S3 couples the analog input signal INN to one electrode of the capacitor C2, the other electrode of which is connected to the other input terminal of the amplifier FAn, being controlled by the signal Q2. The switch S4 couples the reference voltage Vref32 to the capacitor C2, responding to the signal Q2N. The switch S5 couples the reference voltage Vref1 to one electrode of the capacitor C3, the other electrode of which is connected to one input terminal of the amplifier FAp, being controlled by the signal Q1N supplied from the switch controller 80. The switch S6 couples the analog input signal INP to the capacitor C3, responding to the signal Q1 generated from the switch controller 80. The switch S7 couples the analog input signal INN to one electrode of the capacitor C4, the other electrode of which is connected to the other input terminal of the amplifier FAp, responding to the signal Q1. The switch S8 couples the reference voltage Vref32 to the capacitor C4, responding to the signal Q1N. The capacitors C1~C4 are provided to conduct sampling functions against their corresponding amplifiers, detecting the offset voltages at the input terminals of FAn and FAp.

The amplifiers FAn and FAp are two-input/two-output differential types. Switch S9 is interposed between the one input terminal and one output terminal of the amplifier FAn, and controlled by the signal Q2N. The switch S10 is interposed between the other input terminal and the other output terminal of the amplifier FAn, and controlled by the signal Q2N. The switch S11 is interposed between the one input terminal and one output terminal of the amplifier FAp, and controlled by the signal Q1N. The switch S12 is interposed between the other input terminal and the other output terminal of the amplifier FAp, and controlled by the signal Q1N. The outputs of the amplifier FAn are applied to sense amplifier SA through the switches S13 and S14, respectively. The switches S13 and S14 are controlled by the signal Q2P supplied from the switch controller 80. The outputs of the amplifier FAp are applied to the sense amplifier SA through the switches S15 and S16 which are controlled by the signal Q1P. Between two input terminals of the sense amplifier SA, the switch S17 is connected in response to the clock signal QL. The amplifiers FAn and FAp, i.e., a two-way alternative amplifier, act as a first amplifying stage with operating in an alternative mode each other, and the sense amplifier SA does a second-stage amplifying operation with receiving the outputs from FAn and FAp continuously and alternatively.

Now, referring to FIG. 6, the operation for converting the analog input signals, INP and INN, into the digital signals DTs will be described hereinafter. Basically, the amplifying comparators A1~A32 conduct the auto-zero functions for eliminating the static off-set at the amplifying and latching stages, as well as comparing the analog input signals with the reference voltages and amplifying the compared results.

The switches connect their signal paths when the control signals for themselves are enabled with high levels. The clock signals QL is toggling with a high frequency. The operating periods throughout the timing sequence on FIG. 6 are composed of amplifying period Tamp and auto-zero period Taz, in view of oscillating with Q1 or Q2. Q1P and Q2P determine data transfer periods Ttrn, and Q1n and Q2N define periods for eliminating the static offsets, Tos. The signals Q1, Q1N, and Q1P are assigned to control the signal path employing FAp, while the signals Q2, Q2N, and Q2P are assigned to control the signal path including employing FAn.

It should be noted that a pulse width of Tos is shorter than that of Taz. In addition, the amplifying periods by Q1 and Q2, Tamp, are overlapped between each other. The transferring periods by Q1P and Q2P, Ttrn, are overlapped between each other by ΔOLP, so that the latches in latching comparator 90 can receive the amplified signals from the amplifying comparator 60 throughout an entire operating period. Those arrangements with the pulse widths of the signals are provided to secure a stable conduction of data processing and to overcome a synchronous timing control in a high bandwidth operation.

In the Path through FAp

Before amplifying, during Taz, the reference voltages Vref1 and Vref32 are coupled to the nodes N3 and N4 (one electrodes of the capacitors C3 and C4), respectively, through the switches S5 and SS in response to Q1N of high level for Tos. The analog input signals INP and INN can not be applied to the capacitors C3 and C4 because Q1 is low level. Since Q1N also makes the path from the input terminals to output terminals of FAp short through S11 and S12, the voltages at the nodes N7 and N8 (the other electrodes of C3 and C4) become Vref1-Vosp1 and Vref32-Vosp2, respectively. Vosp1 and Vosp2 are static DC offset voltages at the inverted and non-inverted input terminal of FAp. It would be understood that the capacitors C3 and C4 hold charges to compensate the offset voltages of FAp.

Next, Q1N goes to low level and thereby S5, S8, S11, and S12 are shut off. During Q1 is on high level for Tamp and Q1N (almost a complementary signal of Q1) is on low level, the analog input signals INP and INN are applied to the nodes N3 and N4 through the switches S6 and S7. Then, at the input terminals of FAp, INP-Vref32-Vosp1 and INN-Vref1-Vosp2 are charged, and FAp generates amplified output signals having the values of $\alpha$ (INP-Vref32-Vosp1) and $\alpha$ (INN-Vref1-Vosp2). The parameter a means a gain of the amplifier FAp. Since Q1P is high level for Ttrn, the amplified signals from FAp are transferred to nodes N9 and N10 through the switches S15 and S16. Then, the sense amplifier SA generates the secondary amplified signals, i.e., the VP1 and VP1B, the final outputs of the amplified comparator A1, that are to be applied to the corresponding latch (e.g., L1). The secondary amplified signals from the sense amplifier SA are evaluated with including a gain $\beta$ of the sense amplifier SA.

In the Path through FAn

Figure 6:
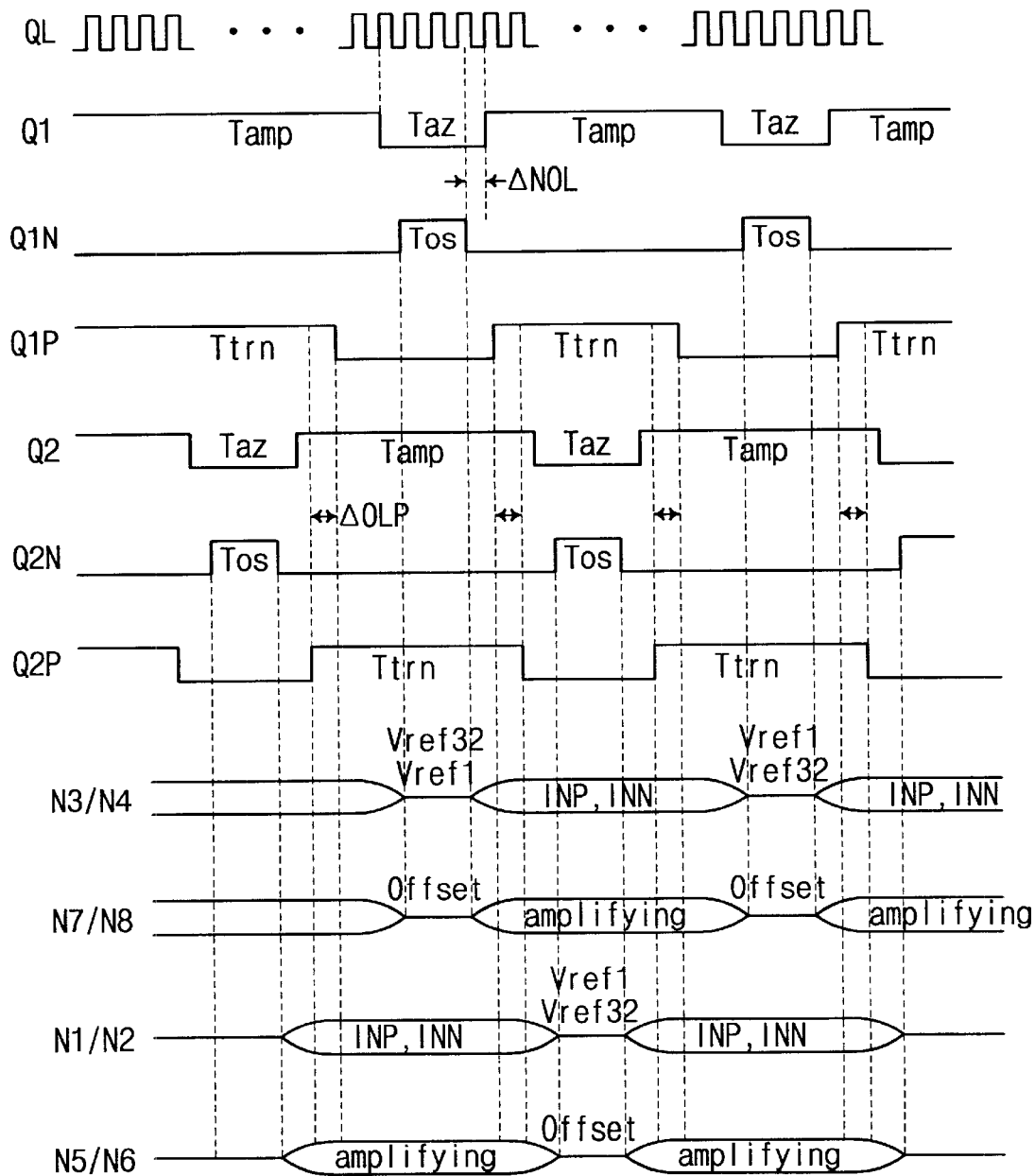
FIG. 6 is a timing diagram of signals and voltages, being involved in the operation of the circuit of FIG. 5.

Alternatively with the amplifying and auto-zero operations with the path through FAp, the path through FAn carries out the auto-zero and amplifying operations, as shown in FIG. 6, under the control with Q2, Q2N, and Q2P.

Namely, before amplifying, during Taz, the reference voltages Vref1 and Vref32 are coupled to the nodes N1 and N2 (electrodes of the capacitors C1 and C2), respectively, through the switches S1 and S4 in response to Q2N of high level for Tos. The analog input signals INP and INN can not be applied to the capacitors because Q2 is low level for Toz. Since Q2N also makes the path from the input terminals to output terminals of FAn short through S9 and S10, the voltages at the nodes N5 and N6 (the other electrodes of C1 and C2) become Vref1-Vosn1 and Vref32-Vosn2, respectively. Vosn1 and Vosn2 are static DC offset voltages at the inverted and non-inverted input terminal of FAn. It would be understood that the capacitors C1 and C2 hold charges to compensate the offset voltages of FAn, as C3 and C4 do.

Next, Q2N goes to low level and thereby S1, S4, S9, and S10 are turned off. During Q2 is on high level for Tamp and Q2N (almost a complementary signal of Q1) is on low level, the analog input signals INP and INN are applied to the nodes N1 and N2 through the switches S2 and S3. Then, at the input terminals of FAn, INP-Vref32-Vosn1 and INN-Vref1-Vosn2 are charged, and FAn generates amplified output signals having the values of $\alpha$ (INP-Vref32-Vosn1) and α (INN-Vref1-Vonp2). The parameter α means a gain of the amplifier FAn. Since Q2P is high level for Ttm, the amplified signals from FAn are transferred to nodes N9 and N1 through the switches S13 and S14. Then, the sense amplifier SA generates the secondary amplified signals, i.e., the VP1 and VP1B, the final outputs of the amplified comparator A1, that are to be applied to the corresponding latch (e.g., L1). The secondary amplified signals from the sense amplifier SA are evaluated with including a gain β of the sense amplifier.

Since the amplifiers FAn and FAp generates their output signals alternatively and then the switches S13/S14 and S15/S16 transfer them to the nodes N9 and N10, the input terminals of the sense amplifier SA receive continuous amplified signals. However, as the switch S17 is turned on and off by means of QL that is oscillating with a high frequency, e.g., 300 MHz, N9 and N10 (the input terminals of SA) are charged up to the voltage levels of the current output signals from FAn or FAp only when QL is low level N9 and N10 are reset to the level of reference voltage difference, ΔVR (=Vref1-Vref32), as shown in FIG. 7A illustrating output levels of the latch (e.g., L1) and the output signals of the amplifier (e.g., FAn or FAp).

Figure 7A:
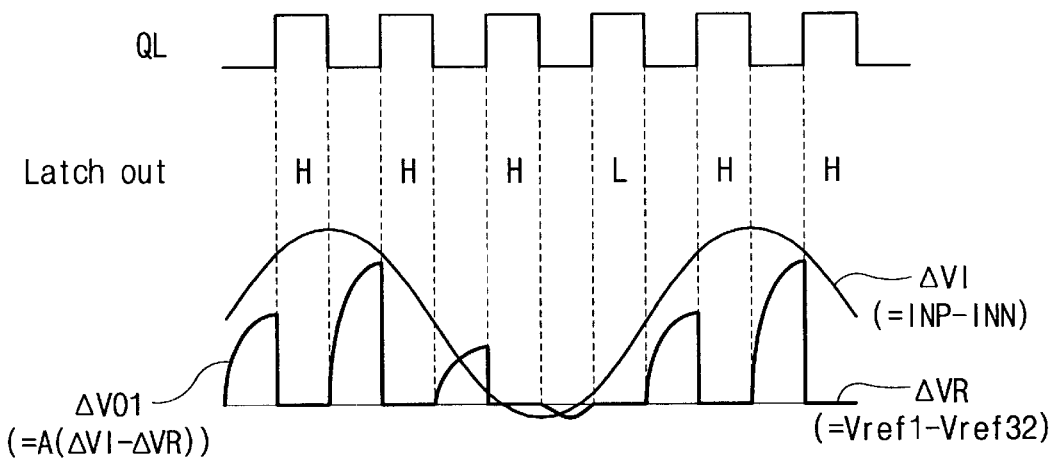
FIGS. 7A and 7B show waveforms generated from the bottom and top amplifiers of FIG. 4, respectively.
Figure 7B:
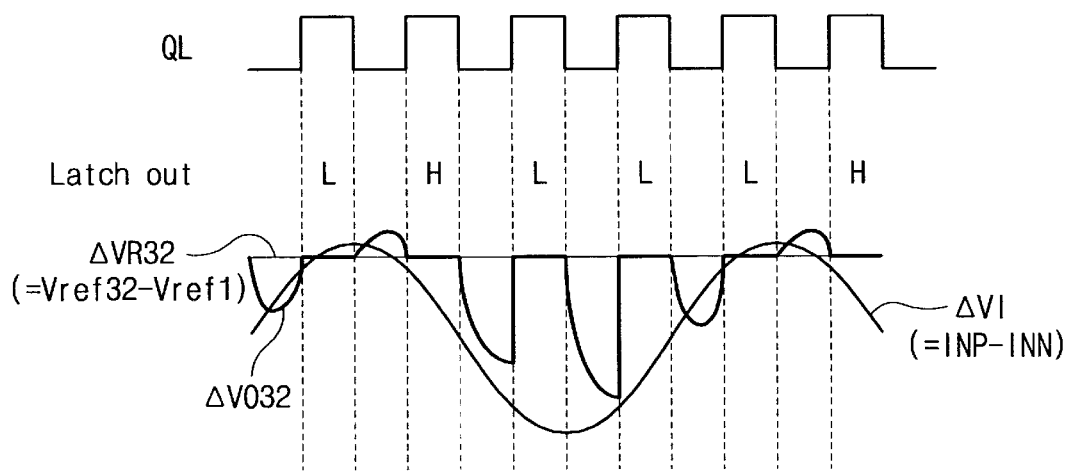

In FIG. 7A, it can be seen that, although there is a comparing point where ΔVI (voltage difference between the analogue input signals; INP-INN) is slightly positioned under ΔVR, conditioning a very small difference therebetween, ΔVO1 (voltage difference between the output terminals of the amplifier, e.g., FAn) can be read as a lower level than ΔVR. That is because the staring level of the amplification is from the reset level of ΔVR forced by QL. Also, in FIG. 7B illustrating the case of the top amplifying comparator (e.g., A32), although there is a comparing point where ΔVI is slightly higher than ΔVR, conditioning a very small difference therebetween, ΔVO32 (voltage difference between the output terminals of the amplifier like FAn in FIG. 5) can be read as high level.

Such wave forms of the output signals from the amplifier will be more clarified in the latching comparator 90, after passing through the sense amplifier SA. The output signals from the latching comparator 90 become continuous digital data, and then generated into 6-bit digital data by the digital encoder 100.

As represented in FIG. 6, the operational sequence with the amplifying, transferring, and performing auto-zero function are proceeded in an asynchronous feature, which is very slower operation in the order of several MHz rather than the high bandwidth clock signal of about 300 MHz. Regarding that the sense amplifier SA generates its amplified signals in sequence from the continuously supplied output signals of the amplifiers (FAn and FAp, alternatively), and the latch comparator 90 generates clarified digital signals in response to QL, the frequency disharmony between the amplifiers and the clock signal may not be a disturbance in accomplishing the technical goal.

As described above, the ADC of the invention can accomplish a faster conversion and a higher resolution by means of two-way alternative amplifying in the amplifying comparator and resetting the amplified signals on the reference voltage level in response to the high bandwidth clock signal.

While the invention has been described in terms of an exemplary embodiment, it is contemplated that it may be practiced as outlined above with modifications within the spirit and scope of the appended claims.

What is claimed is:

1. An analog-to-digital converter comprising:

a reference generator circuit for generating a plurality of reference voltages;

an amplifying comparator circuit comprising a plurality of amplifying comparators for receiving the reference voltages and analog input signals, each of the plurality of amplifying comparators including: a first amplifying path having a first amplifier and a second amplifying path having a second amplifier; and a sense amplifier for alternatively receiving signals from the first and second amplifying paths;

a latching comparator circuit comprising a plurality of latches and receiving a plurality of output signals from the amplifying comparator circuit; and a digital encoder receiving output signals from the latching comparator circuit and generating a predetermined number of data bits.

2. The analog-to-digital converter of claim 1, wherein amplifying periods through the two amplifying paths overlap for a predetermined time.

3. The analog-to-digital converter of claim 1, wherein each of the amplifying comparators further comprises: a capacitor for sampling an offset voltage of the first amplifier; a first switch for shorting input and output terminals of the first amplifier; a second switch for resetting output signals from the first amplifier into a predetermined voltage level in response to a clock signal; and a plurality of switches for controlling a transfer with the reference voltages, the analog input signals, and the output signals from the first amplifier.

4. The analog-to-digital converter of claim 3, wherein the capacitor is coupled to the input terminal of the first amplifier.

5. The analog-to-digital converter of claim 1, wherein the number of latches is one less than twice of the number of the amplifying comparators.

* * * * *